(12) United States Patent
Torii et al.

(10) Patent No.: US 11,349,515 B2
(45) Date of Patent: May 31, 2022

(54) LIMITER CIRCUIT

(71) Applicant: MITSUBISHI ELECTRIC CORPORATION, Tokyo (JP)

(72) Inventors: Takuma Torii, Tokyo (JP); Masatake Hangai, Tokyo (JP); Koji Yamanaka, Tokyo (JP); Kazuhiro Nishida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 144 days.

(21) Appl. No.: 17/002,281

(22) Filed: Aug. 25, 2020

(65) Prior Publication Data
US 2020/0389199 A1 Dec. 10, 2020

Related U.S. Application Data

(63) Continuation of application No. PCT/JP2018/017433, filed on May 1, 2018.

(51) Int. Cl.
  *H03G 11/00* (2006.01)
  *H04B 1/18* (2006.01)
  *H03G 11/02* (2006.01)

(52) U.S. Cl.
  CPC ............... *H04B 1/18* (2013.01); *H03G 11/02* (2013.01)

(58) Field of Classification Search
  CPC ....... H03G 11/025; H03G 11/006; H01P 1/15; H01P 1/215; H03H 2/001
  USPC .......................................................... 333/17.2
  See application file for complete search history.

(56) References Cited

U.S. PATENT DOCUMENTS

| | | | |
|---|---|---|---|
| 4,810,980 A * | 3/1989 | Heston | H01P 1/15 333/17.2 |
| 8,918,068 B1 * | 12/2014 | Helms | H01L 27/0255 330/10 |

FOREIGN PATENT DOCUMENTS

| | | |
|---|---|---|
| JP | 2011-160262 A | 8/2011 |
| JP | 2012-195676 A | 10/2012 |

\* cited by examiner

*Primary Examiner* — Quan Tra
(74) *Attorney, Agent, or Firm* — Birch, Stewart, Kolasch & Birch, LLP

(57) ABSTRACT

A first inductor is connected to an input terminal through a capacitive element. To the first inductor, an anti-parallel diode pair including a first diode and a second diode, and a second inductor are connected. The first inductor and the anti-parallel diode pair are coupled to each other by an electromagnetic field, thereby forming a coupling capacitance.

3 Claims, 4 Drawing Sheets

LIMITER CIRCUIT

CROSS REFERENCE TO RELATED APPLICATIONS

This application is a Continuation of PCT International Application No. PCT/JP2018/017433, filed on May 1, 2018, which is hereby expressly incorporated by reference into the present application.

TECHNICAL FIELD

The invention relates to a limiter circuit that reduces power of a high frequency signal when the power exceeds a predetermined value and that has band-pass filter characteristics.

BACKGROUND ART

There is a limiter circuit that suppresses, when power of a high frequency signal provided to an input terminal exceeds a predetermined value, the power of the high frequency signal to be equal to or less than the predetermined value, and that has band-pass filter characteristics (see, for example, Patent Literature 1). In the limiter circuit, a capacitor and an anti-parallel diode pair are connected in series with each other between an RF main line and ground. In such a limiter circuit, when a signal with a small level of input power is inputted from the input terminal, the anti-parallel diode pair is in an off state and can be considered to be a parasitic capacitance. At this time, by a matching circuit and the parasitic capacitance, a band-pass filter is formed. Hence, signals outside a set frequency band are cut off by the band-pass filter and are not transmitted to an output terminal. On the other hand, in a case of a large signal, the anti-parallel diode pair goes into an on state and has a low impedance, and thus shows high reflectance properties. Hence, when the level of input power is large, the signal is not transmitted to the output terminal, and the anti-parallel diode pair operates as a limiter circuit.

CITATION LIST

Patent Literatures

Patent Literature 1: JP 2012-195676 A

SUMMARY OF INVENTION

Technical Problem

However, suppression of signals outside the set frequency band is insufficient in the above-described conventional limiter circuit, and thus, a filter circuit needs to be prepared separately, thereby causing a problem that it is difficult to achieve miniaturization of the limiter circuit.

The invention is made to solve a problem such as that described above, and an object of the invention is to provide a limiter circuit that can sufficiently suppress signals outside a set frequency band and that suppresses an increase in the number of parts.

Solution to Problem

A limiter circuit according to the invention includes: a capacitive element having a first end connected to an input terminal to which a high frequency signal is provided; a first inductor having a first end connected to a second end of the capacitive element; a first diode having an anode connected to a second end of the first inductor and having a cathode grounded; a second diode having a cathode connected to the second end of the first inductor and having an anode grounded; and a second inductor having a first end connected to the second end of the first inductor and having a second end grounded, and the first inductor and at least one of the first diode and the second diode have an electromagnetic field coupling relationship, the second inductor and at least one of the first diode and the second diode have an electromagnetic field coupling relationship, or the first inductor and one of the first diode and the second diode have an electromagnetic field coupling relationship and the second inductor and the other one of the first diode and the second diode have an electromagnetic field coupling relationship.

Advantageous Effects of Invention

In the limiter circuit of the invention, the capacitive element is connected to the input terminal and the first inductor is connected to the capacitive element. To the first inductor, an anti-parallel diode pair and the second inductor in parallel to the anti-parallel diode pair are connected. The first inductor and the anti-parallel diode pair are coupled to each other by an electromagnetic field, thereby forming a coupling capacitance. As a result, signals outside the set frequency band can be sufficiently suppressed, and an increase in the number of parts included in the limiter circuit can be suppressed.

DESCRIPTION OF EMBODIMENTS

To describe the invention in more detail, modes for carrying out the invention will be described below by referring to the accompanying drawings.

First Embodiment

Figure 1:
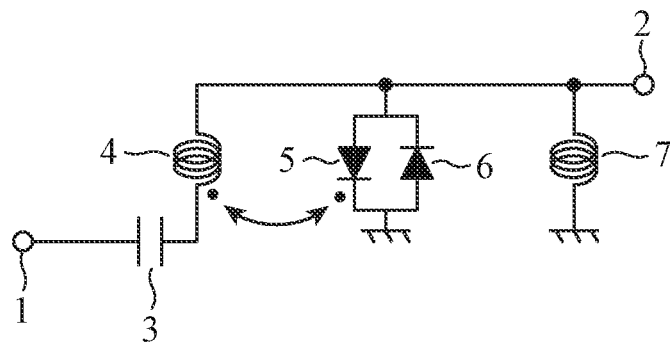
FIG. 1 is a configuration diagram showing a limiter circuit according to a first embodiment of the invention.

FIG. 1 is a configuration diagram showing a limiter circuit according to the present embodiment. The limiter circuit shown in FIG. 1 includes an input terminal 1, an output terminal 2, a capacitive element 3, a first inductor 4, an anti-parallel diode pair including first and second diodes 5 and 6, and a second inductor 7.

The input terminal 1 is a terminal to which a high frequency signal is provided, and the output terminal 2 is a terminal that outputs a high frequency signal. Note that high frequency signals are signals with frequencies used for radio communication. The capacitive element 3 is a capacitive element having one end connected to the input terminal 1 and having the other end connected to one end of the first inductor 4. The other end of the first inductor 4 is connected to an anode of the first diode 5, a cathode of the second diode 6, and the output terminal 2. The first diode 5 and the second diode 6 are an anti-parallel diode pair in which the first diode 5 and the second diode 6 are connected in parallel to each other in opposite directions, and a cathode of the first diode 5 and an anode of the second diode 6 are grounded. The first inductor 4 and at least one of the first diode 5 and the second diode 6 are configured to form a coupling capacitance by electromagnetic field coupling. The limiter circuit of FIG. 1 shows an example in which only the first diode 5 is coupled to the first inductor 4 by an electromagnetic field. One end of the second inductor 7 is connected to the anode of the first diode 5, the cathode of the second diode 6, and the output terminal 2, and the other end of the second inductor 7 is grounded.

For the first diode 5 and the second diode 6, field-effect transistors, e.g., metal-oxide-semiconductor (MOS) transistors, or compound semiconductors such as gallium nitride (GaN) may be used.

Figure 2:
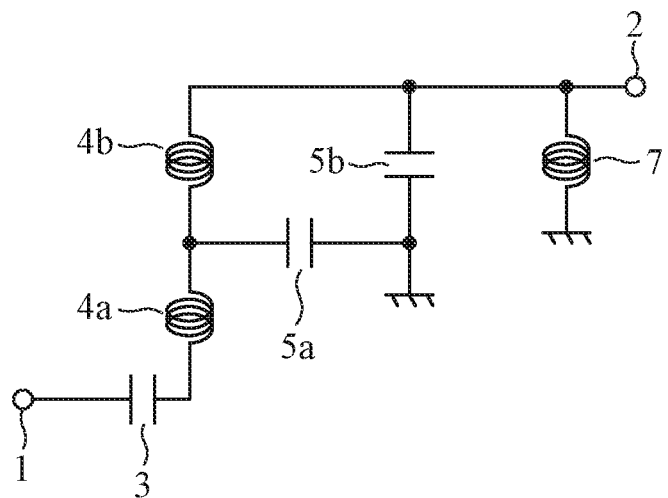
FIG. 2 is an equivalent circuit diagram of the limiter circuit of FIG. 1 at low input power.
Figure 3:
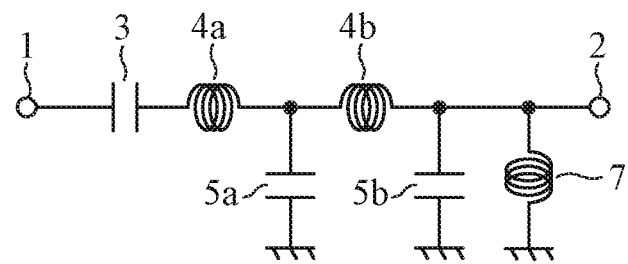
FIG. 3 is an equivalent circuit diagram that depicts an input terminal and an output terminal of an equivalent circuit of FIG. 2 lying on a straight line.

FIG. 2 shows an equivalent circuit of the limiter circuit of FIG. 1 at low input power. In addition, FIG. 3 depicts the input terminal 1 and the output terminal 2 of the equivalent circuit of FIG. 2 lying on a straight line.

At low input power, the first and second diodes 5 and 6 are in an off state and thus are a capacitance, and are represented by a parasitic capacitance 5b. A part of the first inductor 4 and the first diode 5 or the second diode 6 form a coupling capacitance 5a by electromagnetic field coupling. An inductor 4a and an inductor 4b each represent a part of the first inductor 4. One end of the inductor 4a is connected to the capacitive element 3, and the other end of the inductor 4a is connected to one end of the inductor 4b and one end of the coupling capacitance 5a. The other end of the coupling capacitance 5a is grounded. The other end of the inductor 4b is connected to the parasitic capacitance 5b and the second inductor 7.

Figure 4:
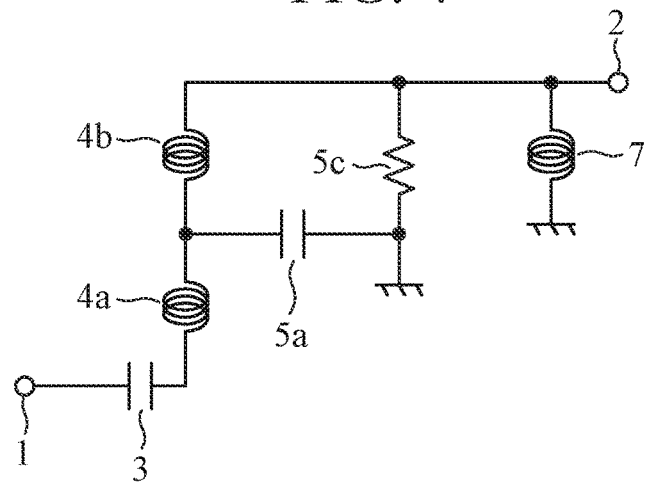
FIG. 4 is an equivalent circuit diagram of the limiter circuit of FIG. 1 at high input power.
Figure 5:
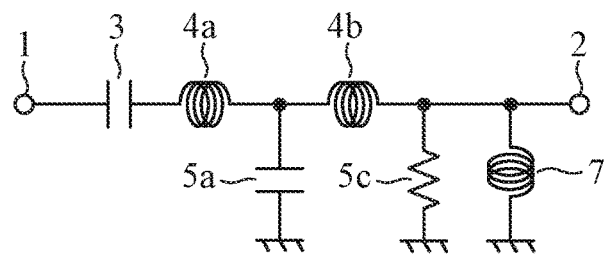
FIG. 5 is an equivalent circuit diagram that depicts an input terminal and an output terminal of an equivalent circuit of FIG. 4 lying on a straight line.

FIG. 4 shows an equivalent circuit of the limiter circuit of FIG. 1 at high input power. In addition, FIG. 5 depicts the input terminal 1 and the output terminal 2 of the equivalent circuit of FIG. 4 lying on a straight line.

At high input power, the first and second diodes 5 and 6 are in an on state and thus are represented by a parasitic resistance 5c. The one end of the inductor 4a is connected to the capacitive element 3, and the other end of the inductor 4a is connected to the inductor 4b and the coupling capacitance 5a. The other end of the coupling capacitance 5a is grounded. The other end of the inductor 4b is connected to the parasitic resistance 5c and the second inductor 7.

Namely, the limiter circuit of the first embodiment includes the capacitive element 3 that cuts off low frequencies; the anti-parallel diode pair that has a grounded capacitance at low input power and has a low resistance at high input power; the first inductor 4 that forms a coupling capacitance by electromagnetic filed coupling to the anti-parallel diode pair; and the second inductor 7 connected in parallel to the anti-parallel diode pair.

Next, operation of the limiter circuit according to the first embodiment will be described.

First, operation performed at low input power will be described. At low input power, the first and second diodes 5 and 6 are in an off state and thus can be considered to be the parasitic capacitance 5b (see FIGS. 2 and 3).

Figure 6:
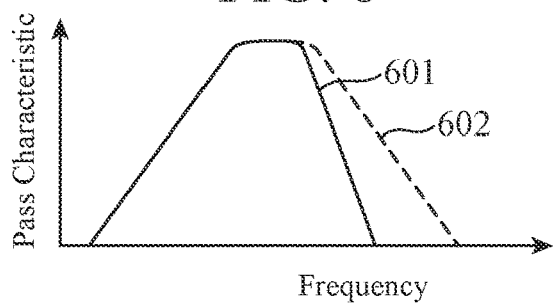
FIG. 6 is an explanatory diagram showing a comparison between a frequency characteristic in a pass characteristic of the limiter circuit obtained when the limiter circuit according to the first embodiment of the invention operates at low input power, and a frequency characteristic in a pass characteristic of a conventional limiter circuit.

A high frequency signal is inputted from the input terminal 1. At this time, by the capacitive element 3, a direct-current component does not flow. The coupling capacitance 5a has a sufficiently low impedance at frequencies higher than a set frequency band, and thus, operates as a high-frequency cutoff filter. In the set frequency band, the impedance of the coupling capacitance 5a is sufficiently large and can be considered to be open. At this time, the equivalent circuits of FIGS. 2 and 3 can be each considered to be a band-pass filter by the capacitive element 3, the inductors 4a and 4b, the parasitic capacitance 5b, and the second inductor 7. FIG. 6 shows frequency characteristics in pass characteristics of the limiter circuits during operation at low input power. A characteristic 601 indicated by a solid line is a characteristic of the limiter circuit of the first embodiment, and a characteristic 602 indicated by a broken line is a characteristic of the conventional limiter circuit. The limiter circuit of the first embodiment can obtain a steep cutoff characteristic by the attenuation characteristics of the high-frequency cutoff filter and the band-pass filter.

Next, operation performed at high input power will be described. At high input power, when a voltage applied to the first and second diodes 5 and 6 takes a positive value, the first diode 5 is an on state and is represented by a parasitic resistance; on the other hand, the second diode 6 is in an off state. When a voltage applied to the first and second diodes 5 and 6 takes a negative value, the second diode 6 goes is an on state and is represented by a parasitic resistance, and the first diode 5 is in an off state. Hence, at high input power, the first diode 5 or the second diode 6 is in an on state, and thus, is represented by an equivalent circuit of the parasitic resistance 5c (see FIGS. 4 and 5).

By allowing the parasitic resistance 5c to have a sufficiently small resistance value, the parasitic resistance 5c operates as a low-impedance circuit with a large reflection coefficient. Hence, a signal provided to the input terminal 1 is reflected by the parasitic resistance 5c and does not reach the output terminal 2. The first and second diodes 5 and 6 serve as a reflection circuit at high input power, and thus operate as a limiter circuit. In addition, the limiter circuit has high-frequency cutoff characteristics by the coupling capacitance 5a.

Note that although the above-described example shows an example in which the first inductor 4 and the anti-parallel diode pair are coupled to each other by an electromagnetic field, the second inductor 7 and the anti-parallel diode pair may be coupled to each other by an electromagnetic field.

As described above, the limiter circuit of the first embodiment includes a capacitive element having one end connected to an input terminal to which a signal in a set frequency band is provided; a first inductor having one end connected to the other end of the capacitive element; a first diode having an anode connected to the other end of the first inductor and having a cathode grounded; a second diode having a cathode connected to the other end of the first inductor and having an anode grounded; and a second inductor having one end connected to the other end of the first inductor and having the other end grounded, and the first inductor and at least one of the first diode and the second diode have an electromagnetic field coupling relationship, or the second inductor and at least one of the first diode and the second diode have an electromagnetic field coupling relationship, and thus, signals outside the set frequency band can be sufficiently suppressed, and an increase in the number of parts included in the limiter circuit is suppressed, thereby enabling miniaturization.

Second Embodiment

A second embodiment is an example in which in addition to the configuration of the first embodiment, the anti-parallel diode pair and the second inductor 7 are coupled to each other by an electromagnetic field.

Figure 7:
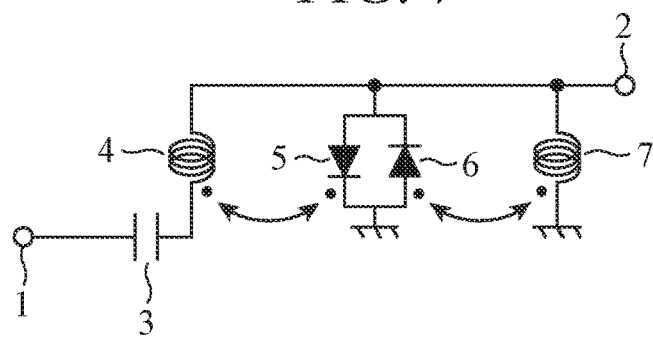
FIG. 7 is a configuration diagram showing a limiter circuit according to a second embodiment of the invention.

FIG. 7 shows a limiter circuit of the second embodiment. A basic configuration is the same as that of the first embodiment shown in FIG. 1, but out of the anti-parallel diode pair including the first diode 5 and the second diode 6, a diode that does not have an electromagnetic field coupling relationship with the first inductor 4 is coupled to the second inductor 7 by an electromagnetic field. Other portions are the same as those of the configuration of FIG. 1, and thus, corresponding portions are given the same reference signs and description thereof is omitted.

Figure 8:
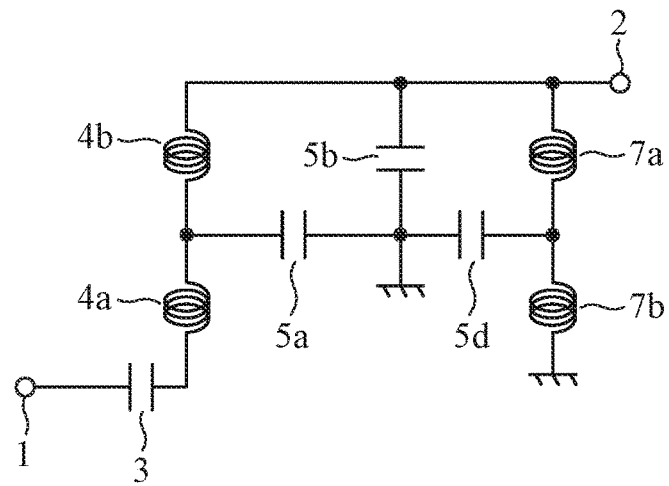
FIG. 8 is an equivalent circuit diagram of the limiter circuit of FIG. 7 at low input power.
Figure 9:
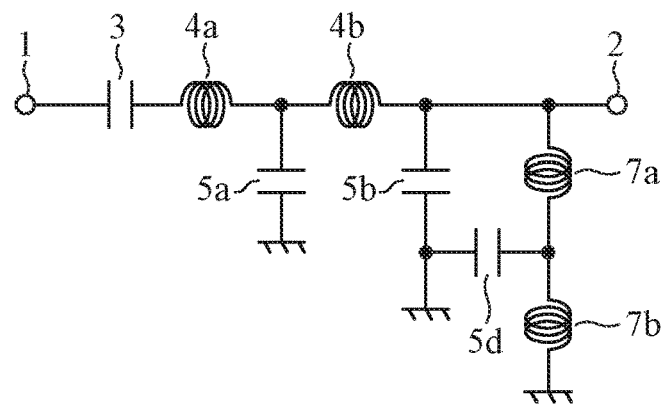
FIG. 9 is an equivalent circuit diagram that depicts an input terminal and an output terminal of an equivalent circuit of FIG. 8 lying on a straight line.

FIG. 8 shows an equivalent circuit of the limiter circuit of FIG. 7 at low input power. In addition, FIG. 9 depicts the input terminal 1 and the output terminal 2 of the equivalent circuit of FIG. 8 lying on a straight line. In these diagrams, components indicated by the same reference signs as those of FIGS. 2 and 3 indicate the same portions as or corresponding portions to those in FIGS. 2 and 3, and description of the components with the same reference signs is omitted.

A part of the second inductor 7 and one of the first diode 5 and the second diode 6 that does not have an electromagnetic field coupling relationship with the first inductor 4 form a coupling capacitance 5d by electromagnetic field coupling. In these diagrams, inductors 7a and 7b each are a part of the second inductor 7.

Figure 10:
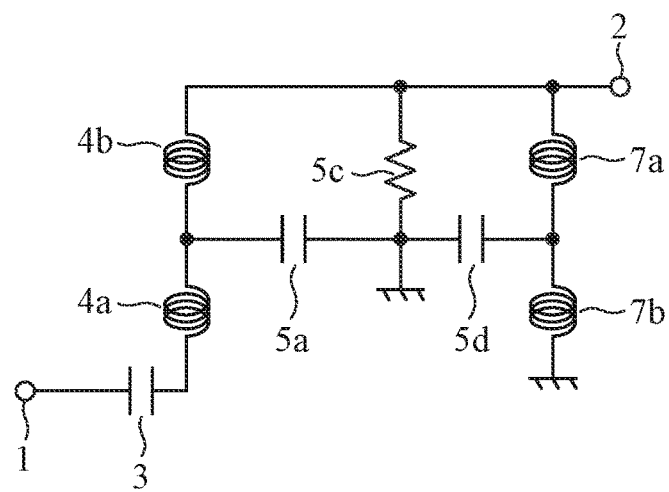
FIG. 10 is an equivalent circuit diagram of the limiter circuit of FIG. 7 at high input power.
Figure 11:
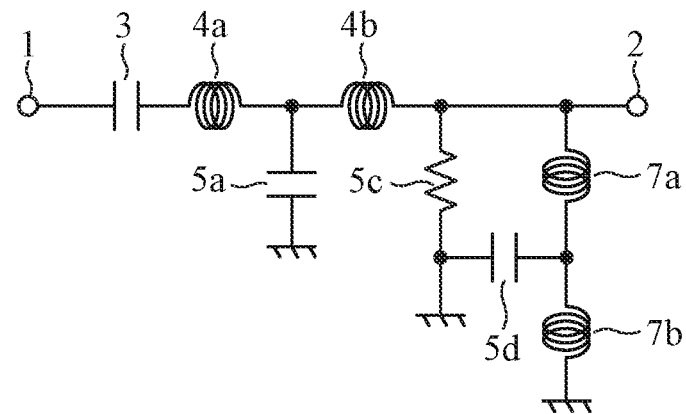
FIG. 11 is an equivalent circuit diagram that depicts an input terminal and an output terminal of an equivalent circuit of FIG. 10 lying on a straight line.

FIG. 10 shows an equivalent circuit of the limiter circuit of FIG. 7 at high input power. In addition, FIG. 11 depicts the input terminal 1 and the output terminal 2 of the equivalent circuit of FIG. 10 lying on a straight line. In these FIGS. 10 and 11, components indicated by the same reference signs as those of FIGS. 4 and 5 in the first embodiment indicate the same portions as or corresponding portions to those in the first embodiment, and description of the components with the same reference signs is omitted.

Next, operation of the limiter circuit according to the second embodiment will be described.

First, operation performed at low input power will be described. At frequencies higher than a set frequency band, a band cut off filter is formed by the inductors 7a and 7b and the coupling capacitance 5d. Namely, a parallel LC circuit is formed by the inductor 7b and the coupling capacitance 5d, and the parallel LC circuit is grounded. The LC circuit has a low impedance at its resonant frequency, which indicates that a low-impedance circuit is connected to ground. Then, signals with frequencies near the resonant frequency are cut off by this low-impedance characteristic. In addition, in the set frequency band, the coupling capacitance 5d has a sufficiently high impedance and thus can be considered to be open. Hence, in the set frequency band, the equivalent circuits of FIGS. 8 and 9 can be each considered to be a band-pass filter by the capacitive element 3, the inductors 4a and 4b, the parasitic capacitance 5b, and the inductors 7a and 7b.

Thus, at frequencies higher than the set frequency band, a steep cutoff characteristic can be obtained by the band-pass filter, a high-frequency cutoff filter formed by the coupling capacitance 5a, and a band cutoff filter formed by the coupling capacitance 5d and the inductors 7a and 7b.

Next, operation performed at high input power will be described. At high input power, the parasitic resistance 5c operates as a limiter circuit. At frequencies higher than the set frequency band, the limiter circuit has a band cutoff characteristic by the coupling capacitance 5d and the inductors 7a and 7b. In addition, the limiter circuit has high-frequency cutoff characteristics by the coupling capacitance 5a. Hence, at frequencies higher than the set frequency band, the limiter circuit has a steep high-frequency cutoff characteristic.

As described above, the limiter circuit of the second embodiment includes a capacitive element having one end connected to an input terminal to which a signal in a set frequency band is provided; a first inductor having one end connected to the other end of the capacitive element; a first diode having an anode connected to the other end of the first inductor and having a cathode grounded; a second diode having a cathode connected to the other end of the first inductor and having an anode grounded; and a second inductor having one end connected to the other end of the first inductor and having the other end grounded, and the first inductor and one of the first diode and the second diode have an electromagnetic field coupling relationship, and the second inductor and the other one of the first diode and the second diode have an electromagnetic field coupling relationship, and thus, signals outside the set frequency band can be sufficiently suppressed, and an increase in the number of parts included in the limiter circuit is suppressed, thereby enabling miniaturization.

Third Embodiment

Figure 12:
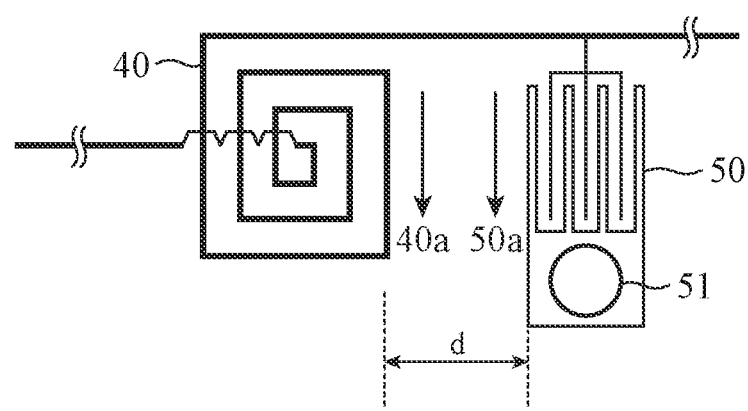
FIG. 12 is a configuration diagram showing a limiter circuit according to a third embodiment of the invention.
Figure 13:
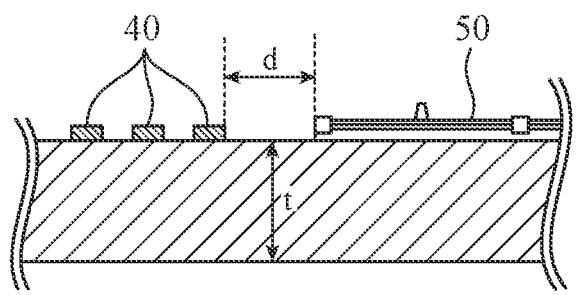
FIG. 13 is a cross-sectional view of a main part of the limiter circuit according to the third embodiment of the invention.

A third embodiment shows an exemplary specific configuration of a limiter circuit. FIG. 12 shows a configuration of a main part of the limiter circuit of the third embodiment. In addition, FIG. 13 shows a cross-sectional view of the main part.

In the limiter circuit of the third embodiment, a diode is formed of a field-effect transistor, and a capacitive element and at least one of the first and second inductors are formed on the same semiconductor substrate. In FIGS. 12 and 13, an inductor 40 corresponds to the first inductor 4 of the first and second embodiments, and a diode 50 corresponds to the first diode 5 of the first and second embodiments. The inductor 40 is formed of a spiral-shaped transmission line. The diode 50 includes a gate electrode and a source electrode, and the source electrode is grounded through a via 51. Note that in FIGS. 12 and 13, depiction of a component corresponding to the capacitive element 3 is omitted. In FIG. 12, a current 40a indicates a current flowing through the inductor 40 and a direction of the current, and a current 50a indicates a current flowing through the source electrode of the diode 50 and a direction of the current.

The inductor 40 and the diode 50 are arranged in such a manner that the directions of the current 40a flowing through the inductor 40 and the current 50a flowing through the source electrode of the diode 50 are identical. The inductor 40 and the diode 50 are arranged in such a manner that a distance d between the inductor 40 and the diode 50 is smaller than a thickness t of the substrate of the field-effect transistor.

Since the current 40a and the current 50a flow in the same direction and the diode and the inductor are closer in distance to each other than to an underside of the substrate which is a ground plane, a strong electromagnetic field coupling effect can be obtained, enabling an increase in flexibility in the design of the coupling capacitance 5a. Note that although FIGS. 12 and 13 show, as an anti-parallel diode pair, the diode 50 corresponding to the first diode 5, a configuration in which the diode 50 corresponds to the second diode 6 may be adopted.

In addition, although the above-described example describes a combination of the inductor 40 corresponding to the first inductor 4 and an anti-parallel diode pair including the first diode 5 and the second diode 6, even in a combination of the second inductor 7 and the anti-parallel diode pair, it can be applied in the same manner. In a case of a combination of the second inductor 7 and the anti-parallel diode pair, flexibility in the design of the coupling capacitance 5d can be increased.

Furthermore, although in the above-described example the anti-parallel diode pair includes field-effect transistors, the anti-parallel diode pair may include bipolar transistors.

As described above, according to the limiter circuit of the third embodiment, the first diode or the second diode is formed of a field-effect transistor, and the capacitive element and the first or second inductor are formed on the same substrate as a substrate on which the first diode or the second diode is formed, and thus, the limiter circuit can be obtained that can sufficiently suppress signals outside the set frequency band and that suppresses an increase in the number of parts.

In addition, according to the limiter circuit of the third embodiment, a direction of a current flowing through the first diode or the second diode and a direction of a current flowing through the first inductor or the second inductor are identical, and a distance between the first diode or the second diode and the first inductor or the second inductor is smaller than a thickness of the substrate, and thus, electromagnetic field coupling formed by the first diode or the second diode and the first inductor or the second inductor can be increased, enabling an increase in flexibility in the design of a coupling capacitance formed by the electromagnetic field coupling.

In the invention of this application, a free combination of the embodiments, modifications to any component of the embodiments, or omissions of any component in the embodiments are possible within the scope of the invention.

INDUSTRIAL APPLICABILITY

As described above, limiter circuits according to the invention relate to a configuration in which when power of a high frequency signal exceeds a predetermined value, the power of the high frequency signal is reduced and signals outside a set frequency band are cut off, and are suitable for achieving miniaturization by suppressing an increase in the number of parts of a limiter circuit having elements provided on a substrate.

REFERENCE SIGNS LIST

1: input terminal, 2: output terminal, 3: capacitive element, 4: first inductor, 5: first diode, 6: second diode, 7: second inductor, 4a, 4b, 7a, 7b, 40: inductor, 5a, 5d: coupling capacitance, 5b: parasitic capacitance, 5c: parasitic resistance, 40a, 50a: current, 50: diode, 51: via

The invention claimed is:
1. A limiter circuit comprising:
a capacitive element having a first end connected to an input terminal to which a high frequency signal is provided;
a first inductor having one end connected to a second end of the capacitive element;
a first diode having an anode connected to a second end of the first inductor and having a cathode grounded;
a second diode having a cathode connected to the second end of the first inductor and having an anode grounded; and
a second inductor having a first end connected to the second end of the first inductor and having a second end grounded, wherein
the first inductor and at least one of the first diode and the second diode have an electromagnetic field coupling relationship, the second inductor and at least one of the first diode and the second diode have an electromagnetic field coupling relationship, or the first inductor and one of the first diode and the second diode have an electromagnetic field coupling relationship and the second inductor and the other one of the first diode and the second diode have an electromagnetic field coupling relationship.

2. The limiter circuit according to claim 1, wherein the first diode or the second diode is formed of a field-effect transistor, and the capacitive element and the first or second inductor are formed on a same substrate as a substrate on which the first diode or the second diode is formed.

3. The limiter circuit according to claim 2, wherein
a direction of a current flowing through the first diode or the second diode and a direction of a current flowing through the first inductor or the second inductor are identical, and
a distance between the first diode or the second diode and the first inductor or the second inductor is smaller than a thickness of the substrate.

* * * * *